(12) United States Patent
Menath

(10) Patent No.: US 9,553,021 B2
(45) Date of Patent: Jan. 24, 2017

(54) METHOD FOR PROCESSING A WAFER AND METHOD FOR DICING A WAFER

(75) Inventor: Markus Menath, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 23 days.

(21) Appl. No.: 13/602,219

(22) Filed: Sep. 3, 2012

(65) Prior Publication Data

US 2014/0065768 A1    Mar. 6, 2014

(51) Int. Cl.
*H01L 21/78* (2006.01)
*H01L 21/308* (2006.01)

(52) U.S. Cl.
CPC ............ *H01L 21/78* (2013.01); *H01L 21/3086* (2013.01)

(58) Field of Classification Search
CPC .................. H01L 21/78; H01L 21/3086
USPC .................. 438/110, 113, 114; 257/E23.001
See application file for complete search history.

(56) References Cited

U.S. PATENT DOCUMENTS

| | | | |
|---|---|---|---|
| 5,501,893 A | | 3/1996 | Laermer et al. |
| 6,221,751 B1* | | 4/2001 | Chen et al. ............... 438/612 |
| 7,198,988 B1* | | 4/2007 | Collins et al. ............ 438/113 |
| 2002/0047210 A1* | | 4/2002 | Yamada et al. ............ 257/774 |
| 2003/0066816 A1* | | 4/2003 | Schultz et al. ............. 216/41 |
| 2003/0096495 A1* | | 5/2003 | Ihara ................. H01L 24/11 438/614 |
| 2004/0121611 A1* | 6/2004 | Arita ............................ 438/710 |
| 2005/0248030 A1* | 11/2005 | Ochiai ............... H01L 23/3114 257/734 |
| 2006/0033168 A1* | 2/2006 | Umemoto ......... H01L 21/76898 257/379 |
| 2006/0043569 A1* | 3/2006 | Benson ............. H01L 21/76898 257/698 |
| 2007/0161234 A1* | 7/2007 | Rinne et al. .................. 438/659 |
| 2007/0262420 A1* | 11/2007 | Arita ............................ 257/620 |
| 2008/0237767 A1* | 10/2008 | Chan et al. .................... 257/433 |
| 2008/0241997 A1* | 10/2008 | Sunohara et al. ............ 438/109 |
| 2008/0311727 A1* | 12/2008 | Chan et al. .................... 438/462 |
| 2009/0017623 A1* | 1/2009 | Kajiyama et al. ........... 438/675 |
| 2009/0023295 A1* | 1/2009 | Arita et al. ................... 438/710 |
| 2009/0057838 A1* | 3/2009 | Arita et al. ................... 257/618 |
| 2009/0065906 A1* | 3/2009 | Tanida et al. ................. 257/621 |
| 2009/0093104 A1* | 4/2009 | Arita et al. ................... 438/462 |
| 2009/0108258 A1* | 4/2009 | An .................................. 257/48 |
| 2009/0121321 A1* | 5/2009 | Miccoli et al. ............... 257/618 |
| 2009/0311830 A1* | 12/2009 | Kang ............................ 438/113 |
| 2011/0180892 A1* | 7/2011 | Jang ................. H01L 27/14618 257/432 |
| 2011/0254159 A1* | 10/2011 | Hwang et al. ................ 257/738 |
| 2012/0322232 A1* | 12/2012 | Holden ......................... 438/462 |
| 2012/0322233 A1* | 12/2012 | Lei et al. ...................... 438/462 |
| 2012/0322234 A1* | 12/2012 | Yalamanchili et al. ...... 438/462 |
| 2012/0322240 A1* | 12/2012 | Holden et al. ................ 438/462 |
| 2012/0322241 A1* | 12/2012 | Holden et al. ................ 438/462 |
| 2012/0322242 A1* | 12/2012 | Lei et al. ...................... 438/462 |
| 2013/0017668 A1* | 1/2013 | Lei et al. ...................... 438/462 |

(Continued)

*Primary Examiner* — Michele Fan
(74) *Attorney, Agent, or Firm* — Viering, Jentschura & Partner MBB

(57) ABSTRACT

In various embodiments, a method for processing a wafer may include: providing a wafer having at least one die region and at least one metallization disposed over the at least one die region; covering the at least one metallization with a protecting layer; plasma etching the wafer to form at least one die.

15 Claims, 7 Drawing Sheets

(56) References Cited

U.S. PATENT DOCUMENTS

| | | | |
|---|---|---|---|
| 2013/0020700 A1* | 1/2013 | Liu | H01L 23/16 257/737 |
| 2013/0147031 A1* | 6/2013 | Chen et al. | 257/737 |
| 2013/0280888 A1* | 10/2013 | Stranzl et al. | 438/462 |
| 2014/0042597 A1* | 2/2014 | Nelle et al. | 257/642 |

* cited by examiner

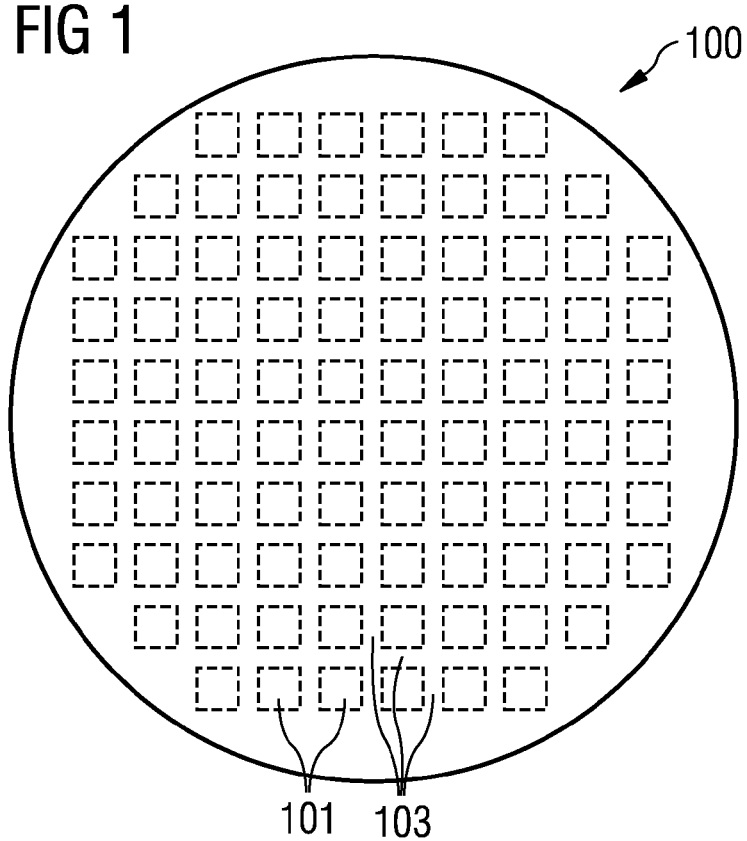
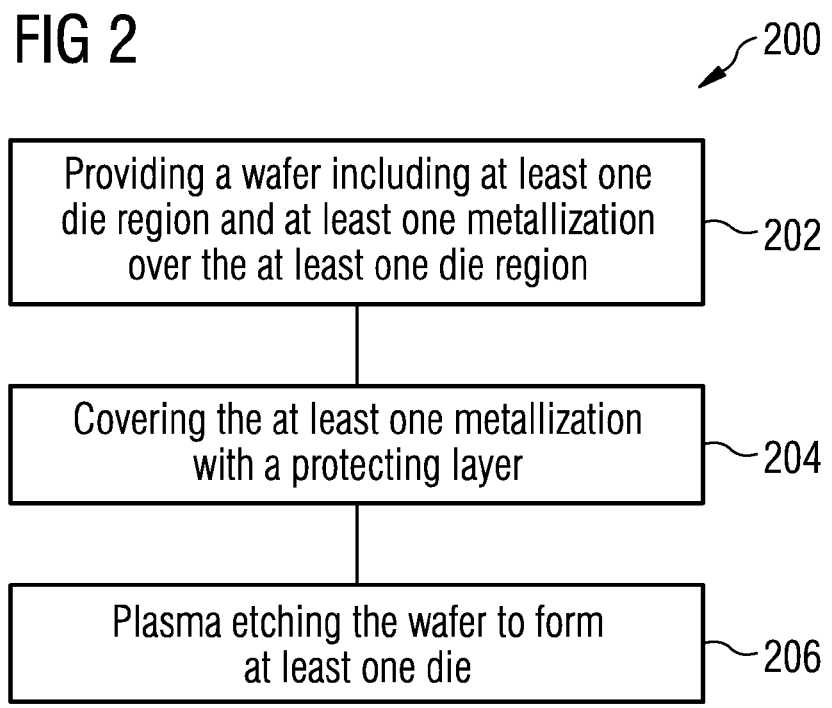

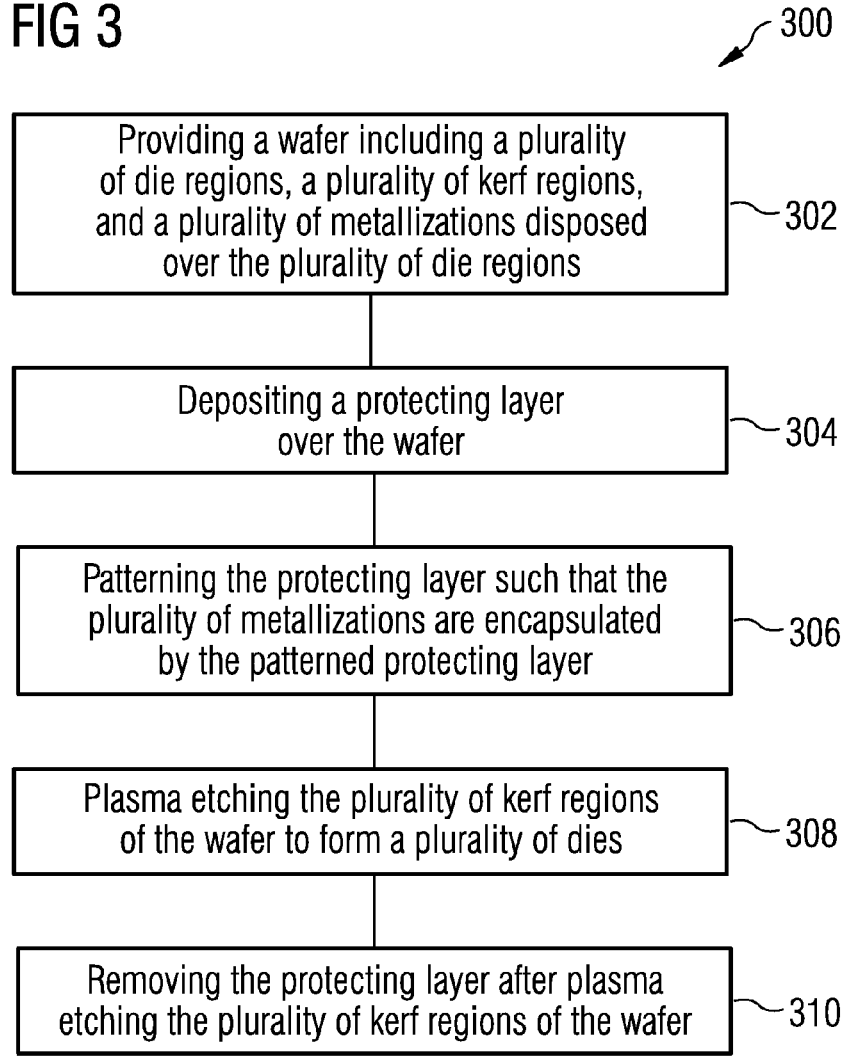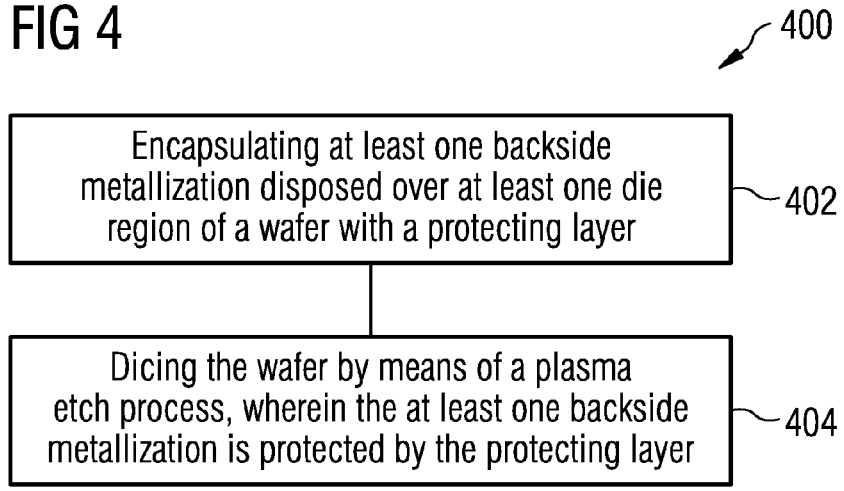

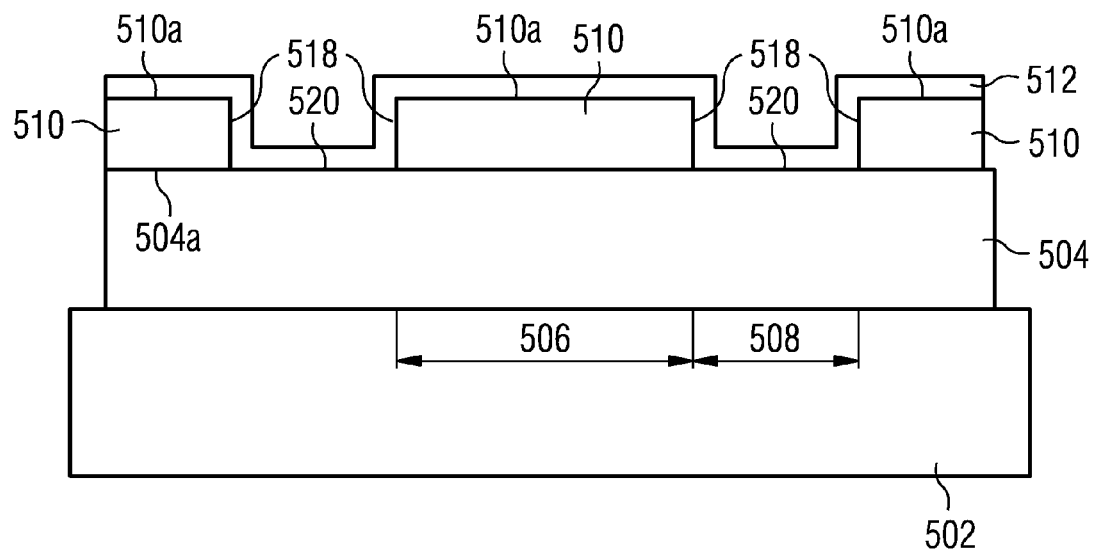
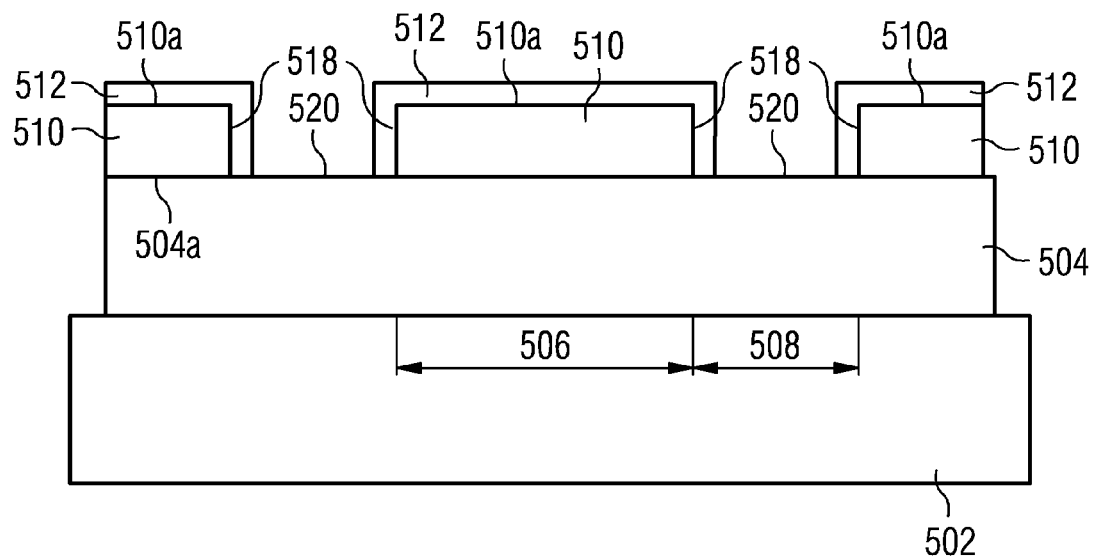

METHOD FOR PROCESSING A WAFER AND METHOD FOR DICING A WAFER

TECHNICAL FIELD

Various embodiments relate generally to a method for processing a wafer, and a method for dicing a wafer.

BACKGROUND

Today, fabrication of semiconductor dies or chips commonly includes so-called dicing, i.e. separation of the individual dies or chips from a substrate, typically a wafer substrate or, short, wafer. In the production lines, dicing currently is achieved by means of mechanical sawing of the substrate. Recently, plasma dicing has appeared for the separation of the dies of a wafer, especially for dicing of very small chips on a wafer. Plasma dicing generally involves etching of the wafer.

However, during the etch process, metallizations provided on the wafer, such as, for example backside metallizations of the chips may be slightly etched or impurities may diffuse into the metallizations, metal material may be "kicked out" from the metallization during etching and contaminate the etch chamber, or an uncontrolled polymerization may occur, which may lead to changed etching rates and/or stability characteristics.

SUMMARY

In various embodiments, a method for processing a wafer may include: providing a wafer having at least one die region and at least one metallization disposed over the at least one die region; covering the at least one metallization with a protecting layer; plasma etching the wafer to form at least one die.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a schematic plan view of a wafer for illustrating various aspects of the disclosure;

FIG. 2 shows a diagram illustrating a method for processing a wafer in accordance with an embodiment;

FIG. 3 shows a diagram illustrating a method for processing a wafer in accordance with another embodiment;

FIG. 4 shows a diagram illustrating a method for dicing a wafer in accordance with another embodiment;

FIG. 5A to FIG. 5D show schematic cross-sectional views illustrating a method for processing a wafer in accordance with an embodiment.

DESCRIPTION

Figure 5C:
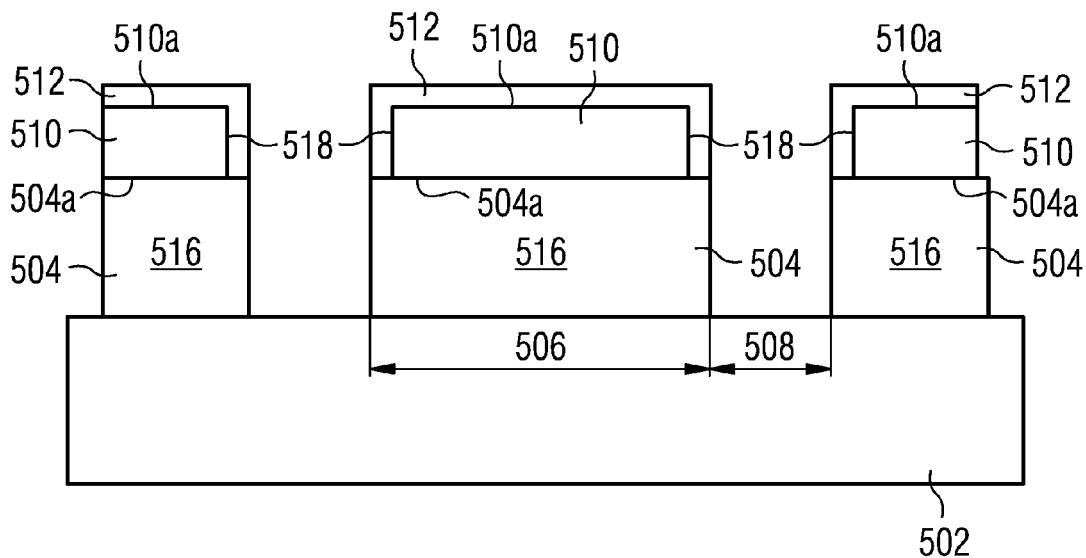

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Note that in this specification, references to various features (e.g., region, layer, process, steps, stack, characteristics, material, etc.) included in "one aspect", "one embodiment", "example aspect", "an aspect", "another aspect", "some aspect", "various aspects", "other aspects", "alternative aspect", and the like are intended to mean that any such features are included in one or more aspects of the present disclosure, but may or may not necessarily be combined in the same aspects. Various aspects of the disclosure are provided for methods, and various aspects of the disclosure are provided for devices or manufactures. It will be understood that basic properties of the methods also hold for the devices or manufactures and vice versa. Therefore, for sake of brevity, duplicate description of such properties may be omitted.

Note that in this specification, references to "at least one of" may mean any combination. For example, at least one of object A and object B may be object A, object B, or both objects A and B.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Although the description is illustrated and described herein with reference to certain aspects, the description is not intended to be limited to the details shown. Modifications may be made in the details within the scope and range equivalents of the claims.

Wafers may commonly be used in the fabrication of integrated circuits (ICs) or chips. A wafer may include a plurality of die regions or integrally-formed dies. The die regions or dies may be separated by a separation process such as sawing. Separation of the dies may also be referred to as dicing.

Usually, dicing may be carried out along so-called dicing streets (sometimes also referred to as sawing streets or scribe lines) running between the dies and may result in the removal of the wafer material and/or destruction of any structures located in those dicing streets. The region of a wafer that will be affected (e.g. destroyed) by the dicing may also be referred to as a kerf region of the wafer.

Recently, plasma dicing has appeared for the separation of the dies of a wafer, especially for dicing of very small chips on a wafer. Plasma dicing generally involves etching of the wafer. However, during the etch process, metallizations provided on the wafer, such as, for example backside metallizations of the chips may be slightly etched or impurities may diffuse into the metallizations, metal material may be "kicked out" from the metallization during etching and contaminate the etch chamber, or an uncontrolled polymerization may occur, which may lead to changed etching rates and/or stability characteristics.

Various embodiments may provide methods for protecting a metallization (for example, one more surfaces of the metallization, e.g. a top surface and/or one or more sidewalls of the metallization) of a chip or wafer, for example a backside-metallization of a chip or wafer, during a plasma etching process, for example a plasma etching process used for dicing a wafer.

FIG. 1 shows a schematic plan view of a wafer for illustrating various aspects of this disclosure. Wafer 100 may include a plurality of die regions 101 separated by kerf regions 103 located between the die regions 101. The number of die regions 101 may be arbitrary. As shown in FIG. 1, the die regions 101 may have a quadratic shape, however the die regions 101 may also have a rectangular shape, or any other shape in general. As shown in FIG. 1, the die regions 101 may be arranged in a rectangular array, however the die regions 101 may also be arranged differently. As shown in FIG. 1, the wafer 100 may have a circular shape, however the wafer 100 may also have a rectangular or quadratic shape, or any other shape in general.

The term "kerf region" as used herein may be understood to refer to a region of a wafer that may be at least partially removed or destroyed in a die separation or dicing process. For example, in accordance with various aspects, the kerf region 103 shown in FIG. 1 may illustratively include or correspond to one or more dicing streets or scribe lines of the wafer 100 (in other words, a line or lines along which the wafer 100 may be diced (e.g. cut, e.g. by means of sawing, laser cutting, or plasma etching)). In accordance with some aspects, the kerf region 103 may be located at least partially between the die regions 101 of the wafer 100. The number of die regions of the wafer 100 may be arbitrary in accordance with various aspects.

The die region 101 or the plurality of die regions of the wafer 100 may have any shape, for example a quadratic or rectangular shape in accordance with some aspects, however any other shape may be possible as well in accordance with some aspects.

In accordance with some aspects, the die regions may be arranged in a rectangular array, e.g. similar to the array shown in FIG. 1. However, in accordance with other aspects, the die regions may be arranged differently.

FIG. 2 shows a method 200 for processing a wafer in accordance with various embodiments. As shown in 202, a wafer including at least one die region and at least one metallization disposed over the at least one die region may be provided. As shown in 204, the at least one metallization may be covered with a protecting layer. As shown in 206, the wafer may be plasma etched to form at least one die.

In accordance with an embodiment, the wafer may include or may be made of a semiconductor material such as, for example, silicon, although other semiconductor materials, including compound semiconductor materials, may be possible as well, for example germanium, silicon germanium, a III-V compound semiconductor material, a II-VI compound semiconductor material, a IV-IV compound semiconductor material, or others. Alternatively or in addition, the wafer may include other materials.

In accordance with another embodiment, the at least one metallization may have been formed by forming a metallization layer over the wafer and patterning the metallization layer.

In accordance with another embodiment, the at least one metallization may be disposed over a backside of the wafer.

In accordance with another embodiment, the at least one metallization may be disposed over a front side of the wafer.

In accordance with another embodiment, forming the metallization layer may include depositing the metallization layer over the wafer.

In accordance with another embodiment, patterning the metallization layer may include etching the metallization layer.

In accordance with another embodiment, patterning the metallization layer may include a lift-off process.

In accordance with another embodiment, the at least one metallization may include or may be made of at least one of copper, aluminum, gold, silver, tin, palladium, zinc, nickel, iron, titanium, or an alloy including at least one of the aforementioned materials. In accordance with another embodiment, other suitable materials may be used for the at least one metallization.

In accordance with another embodiment, the at least one metallization may include a layer stack including one or more layers including or being made of at least one of the aforementioned materials.

In accordance with another embodiment, covering the at least one metallization with the protecting layer may include depositing the protecting layer over the wafer, and patterning the protecting layer such that the at least one metallization is encapsulated by the patterned protecting layer.

In accordance with another embodiment, the protecting layer may include or may be made of a resist material or an imide material (e.g. polyimide material).

In accordance with another embodiment, the resist material may include or be, for example, a photoresist, e.g. an organic photo resist.

In accordance with another embodiment, the protecting layer may include or be made of a hard mask material such as, for example, an oxide material, for example silicon oxide, and/or a nitride material, as e.g. silicon nitride, and/or other suitable hardmask materials.

In accordance with another embodiment, the protecting layer may include a layer stack including an oxide layer and a nitride layer.

In accordance with another embodiment, covering the at least one metallization with a protecting layer may include depositing a first protecting sub-layer to cover a surface of the at least one metallization that faces away from the wafer, depositing a second protecting sub-layer to cover the first protecting sub-layer and at least one sidewall of the at least one metallization, etching the second protecting sub-layer to form at least one spacer covering the at least one sidewall of the at least one metallization.

In accordance with another embodiment, covering the at least one metallization with a protecting layer may include depositing a first protecting sub-layer to cover a surface of the at least one metallization that faces away from the wafer, depositing a second protecting sub-layer to cover the first protecting sub-layer and sidewalls of the at least one metallization, etching the second protecting sub-layer to form spacers covering the sidewalls of the at least one metallization.

In accordance with another embodiment, at least one of the first protecting sub-layer and the second protecting sub-layer may include or consist of a nitride material or an oxide material.

In accordance with another embodiment, the plasma etching may include or may be achieved by a so-called Bosch plasma etching process, which is described, as such, for example in Laermer et al., "Method of anisotropically etching silicon" (U.S. Pat. No. 5,501,893).

In accordance with an embodiment, a Bosch plasma etching process may include: forming a hole, e.g. a channel, in a carrier (for example, a semiconductor or wafer) including at least one die, wherein forming a hole may include selectively removing carrier material, thereby forming a cavity in the carrier by removing carrier material by forming a mask, e.g. a photo-structured resist mask, over the carrier and etching the carrier using the mask (e.g. the resist mask) as an etch mask; forming a passivation material over one or more cavity walls exposed by the selective removal of the carrier material; selectively removing a portion of the passivation material and further carrier material by plasma etching, wherein, during etching, chemically reactive species and/or ions may be generated by electrical discharge in a reactive gas atmosphere; repeatedly alternating between the process of forming passivation material and the process of selectively etching the passivation material and further carrier material until a desired hole depth is formed in the carrier.

In accordance with another embodiment, patterning the protecting layer may include or may be achieved by a photolithography process.

In accordance with another embodiment, the method 200 for processing a wafer may include removing the protecting layer after plasma etching the wafer, for example by means of resist etching or ashing (e.g. in case of a resist material), or by means of etching (e.g. in case of a hard mask material such as a nitride or oxide material) or by means of any other suitable method.

In accordance with another embodiment, plasma etching the wafer may include plasma etching at least one kerf region of the wafer, for example at least one kerf region of the wafer proximate to the at least one die region of the wafer.

In accordance with another embodiment, patterning the metallization layer may include exposing the at least one kerf region (e.g. the at least one kerf region proximate the at least one die region). In other words, patterning the metallization layer may include removing the metallization layer from above the at least one kerf region.

In accordance with another embodiment, plasma etching the wafer may include dicing the wafer.

In accordance with another embodiment, the method 200 may further include grinding the wafer, for example before plasma etching the wafer, or after plasma etching the wafer.

FIG. 3 shows a method 300 for processing a wafer in accordance with various embodiments. As shown in 302, a wafer including a plurality of die regions, a plurality of kerf regions, and a plurality of metallizations disposed over the plurality of die regions, may be provided. A protecting layer may be deposited over the wafer, as shown in 304. As shown in 306, the protecting layer may be patterned such that the plurality of metallizations is encapsulated by the patterned protecting layer. The plurality of kerf regions of the wafer may be plasma etched to form a plurality of dies, as shown in 308. As shown in 310, the protecting layer may be removed after plasma etching the plurality of kerf regions of the wafer.

In accordance with an embodiment, the wafer may include or may be made of a semiconductor material such as, for example, silicon, although other semiconductor materials, including compound semiconductor materials, may be possible as well, for example germanium, silicon germanium, a III-V compound semiconductor material, a II-VI compound semiconductor material, a IV-IV compound semiconductor material, or others. Alternatively or in addition, the wafer may include other materials.

In accordance with another embodiment, the plurality of metallizations may have been formed by forming a metallization layer over the wafer and patterning the metallization layer.

In accordance with another embodiment, the plurality of metallizations may be disposed over a backside of the wafer.

In accordance with another embodiment, the plurality of metallizations may be disposed over a front side of the wafer.

In accordance with another embodiment, forming the metallization layer may include depositing the metallization layer over the wafer.

In accordance with another embodiment, patterning the metallization layer may include etching the metallization layer.

In accordance with another embodiment, patterning the metallization layer may include a lift-off process.

In accordance with another embodiment, the plurality of metallizations may include or may be made of at least one of copper, aluminum, gold, silver, tin, palladium, zinc, nickel, iron, titanium, or an alloy including at least one of the aforementioned materials. In accordance with another embodiment, other suitable materials may be used for the plurality of metallizations.

In accordance with another embodiment, the plurality of metallizations may include a layer stack including one or more layers including or being made of at least one of the aforementioned materials.

In accordance with another embodiment, patterning the metallization layer may include exposing the plurality of kerf regions. In other words, patterning the metallization layer may include removing the metallization layer from above the plurality of kerf regions.

In accordance with another embodiment, the protecting layer may include or may be made of a resist material or an imide material (e.g. polyimide material).

In accordance with another embodiment, the resist material may include or be, for example, a photoresist, e.g. organic photo resist.

In accordance with another embodiment, the protecting layer may include or may be made of a hardmask material such as e.g. an oxide material and/or a nitride material.

In accordance with another embodiment, the oxide material may include or be, e.g. silicon oxide.

In accordance with another embodiment, the nitride material may include or be, e.g. silicon nitride.

In accordance with another embodiment, the protecting layer may include a layer stack including an oxide layer and a nitride layer.

In accordance with another embodiment, depositing the protecting layer over the wafer may include depositing a first protecting sub-layer to cover surfaces of the plurality of metallizations that face away from the wafer, depositing a second protecting sub-layer to cover the first protecting sub-layer and sidewalls of the plurality of metallizations, etching the second protecting sub-layer to form spacers covering the sidewalls of the plurality of metallizations.

In accordance with another embodiment, at least one of the first protecting sub-layer and the second protecting sub-layer may include or consist of a hardmask material such as e.g. a nitride material or an oxide material.

In accordance with another embodiment, the plasma etching may include or may be achieved by a Bosch plasma etching process.

In accordance with another embodiment, patterning the protecting layer may include or may be achieved by a photolithography process.

In accordance with another embodiment, plasma etching the plurality of kerf regions of the wafer may include dicing the wafer.

In accordance with another embodiment, the method 300 may further include grinding the wafer, for example before plasma etching the plurality of kerf regions of the wafer, or after plasma etching the plurality of kerf regions of the wafer.

FIG. 4 shows a method 400 for dicing a wafer in accordance with various embodiments. As shown in 402, at least one backside metallization disposed over at least one die region of a wafer may be encapsulated with a protecting layer. The wafer may be diced by means of a plasma etch process, wherein the at least one backside metallization may be protected by the protecting layer, as shown in 404.

In accordance with an embodiment, the wafer may include or may be made of a semiconductor material such as, for example, silicon, although other semiconductor materials, including compound semiconductor materials, may be possible as well, for example germanium, silicon germanium, a III-V compound semiconductor material, a II-VI compound semiconductor material, a IV-IV compound semiconductor material, or others. Alternatively or in addition, the wafer may include other materials.

In accordance with another embodiment, the at least one backside metallization may have been formed by depositing a metallization layer over the wafer and patterning the metallization layer, e.g. by etching the metallization layer, or by means of a lift-off process.

In accordance with another embodiment, the at least one backside metallization may include or may be made of at least one of copper, aluminum, gold, silver, tin, palladium, zinc, nickel, iron, titanium, or an alloy including at least one of the aforementioned materials. In accordance with another embodiment, other suitable materials may be used for the at least one backside metallization.

In accordance with another embodiment, the at least one backside metallization may include a layer stack including one or more layers including or being made of at least one of the aforementioned materials.

In accordance with another embodiment, encapsulating the at least one backside metallization may include depositing the protecting layer over the at least one backside metallization, and patterning the protecting layer.

In accordance with another embodiment, the protecting layer may include or may be made of a resist material or an imide material (e.g. polyimide material).

In accordance with another embodiment, the resist material may include or be, for example, a photoresist, e.g. an organic photo resist.

In accordance with another embodiment, the protecting layer may include or may be made of a hardmask material such as e.g. an oxide material and/or a nitride material.

In accordance with another embodiment, the oxide material may include or be, silicon oxide.

In accordance with another embodiment, the nitride material may include or be, silicon nitride.

In accordance with another embodiment, the protecting layer may include a layer stack including an oxide layer and a nitride layer.

In accordance with another embodiment, depositing the protecting layer over the wafer may include depositing a first protecting sub-layer to cover a surface of the at least one backside metallization that faces away from the wafer, depositing a second protecting sub-layer to cover the first protecting sub-layer and at least one sidewall of the at least one backside metallization, etching the second protecting sub-layer to form at least one spacer covering the at least one sidewall of the at least one backside metallization.

In accordance with another embodiment, at least one of the first protecting sub-layer and the second protecting sub-layer may include or consist of a hardmask material such as e.g. a nitride material or an oxide material.

In accordance with another embodiment, the plasma etch process may include or may be a Bosch plasma etch process.

In accordance with another embodiment, patterning the protecting layer may include or may be achieved by a photolithography process.

In accordance with another embodiment, dicing the wafer may include plasma etching at least one kerf region of the wafer, for example at least one kerf region of the wafer proximate to the at least one die region of the wafer.

In accordance with another embodiment, patterning the metallization layer may include exposing the at least one kerf region of the wafer proximate to the at least one die region. In other words, patterning the metallization layer may include removing the metallization layer from above the at least one kerf region.

In accordance with another embodiment, dicing the wafer may include plasma etching a plurality of kerf regions of the wafer, each kerf region of the plurality of kerf regions being proximate to one or more die regions of a plurality of die regions of the wafer.

In accordance with another embodiment, the method 400 may further include grinding the wafer, for example before dicing the wafer.

FIG. 5A to FIG. 5D show schematic cross-sectional views illustrating a method for processing a wafer in accordance with an embodiment.

Referring to FIG. 5A, a wafer 504 including at least one die region 506 and at least one kerf region 508 proximate to the at least one die region 506 may be provided, e.g. on a carrier 502. At least one metallization (or metallization structure) 510 may be disposed over the at least one die region 506 of the wafer 504. The at least one metallization 510 may have been formed, for example, by depositing a metallization material over a surface 504a of the wafer 504, e.g. a surface 504a that faces away from the carrier 502, and patterning the metallization material such that the at least one metallization 510 is formed over the at least one die region 506 of the wafer 504. For example, a plurality of metallizations 510 may have been formed, wherein each metallization 510 may have been formed over a respective die region 506 of a plurality of die regions 506 of the wafer 504.

As shown in FIG. 5A, a protecting layer 512 may be formed by depositing a protecting material over the wafer 504 having the at least one metallization 510 over the at least one die region 506 of the wafer 504, such that the protecting layer 512 covers a surface 510a of the at least one metallization 510 facing away from the wafer 504, sidewalls 518 of the metallization 510, and at least one portion 520 of the surface 504a of the wafer 504 over the at least one kerf region 508. For example, the wafer 504 may include a plurality of kerf regions 508, wherein each kerf region 508 may be located proximate or adjacent to one or more die regions 506 of a plurality of die regions 506 of the wafer 504, for example between two or more neighboring die regions 506 of the plurality of die regions 506.

Referring to FIG. 5B, the protecting layer 512 may be patterned such that remaining material of the protecting layer 512 encapsulates the at least one metallization 510 over the surface 504a of the wafer 504, while material of the protecting layer 512 previously covering the at least one portion 520 of the surface 504a of the wafer 504 over the at least one kerf region 508 may be removed again from above the at least one kerf region 508, such that the at least one kerf region 508 of the wafer 504 may be exposed.

According to the embodiment shown in FIG. 5B, the protecting layer 512 may include or consist of a resist material, e.g. a photoresist. In case of a photoresist, patterning the protecting layer 512 may, for example, include or be achieved by a photolithography process, which may include exposing the photoresist (e.g. using a photolithography mask) and developing the photoresist to obtain the patterned protecting layer 512.

Alternatively, the protecting layer 512 may be patterned using other suitable processes, which may be known as such in the art.

In accordance with another embodiment, the protecting layer 512 may include or be made of a hard mask material such as, for example, an oxide material, for example silicon oxide, and/or a nitride material, as e.g. silicon nitride, and/or other suitable hardmask materials.

Referring to FIG. 5C, the wafer 504 may be etched by using a plasma etching process, e.g. a Bosch plasma etching process (alternatively, other plasma etching processes), for example by etching the wafer material in the at least one kerf region 508 to form at least one die (or chip) 516. As shown, the at least one die 516 may include the at least one die region 506, and the at least one metallization 510 disposed over the at least one die region 506 and encapsulated by the remaining material of the protecting layer 512.

Figure 5D:
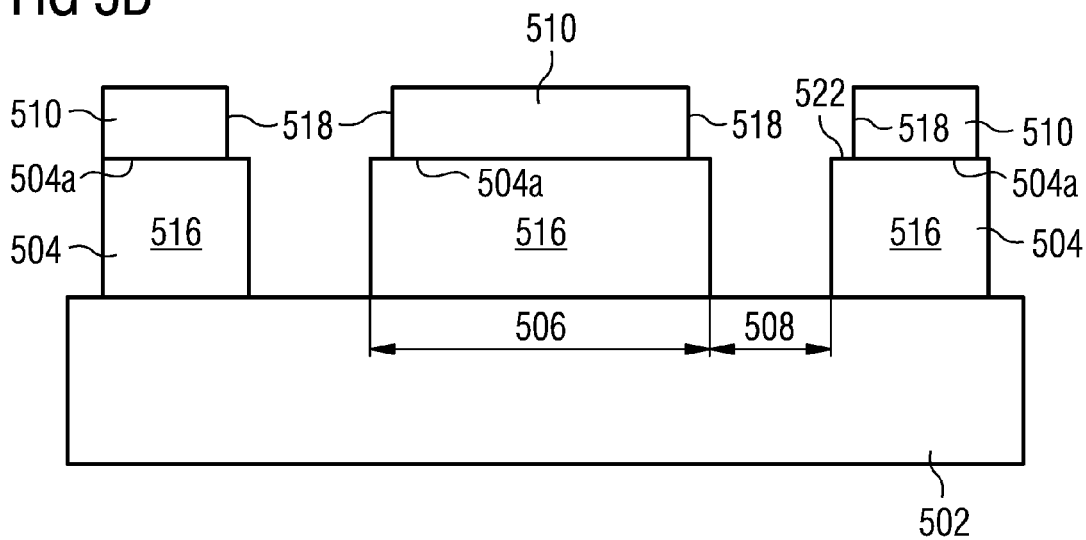

Referring to FIG. 5D, the remaining material of the protecting layer 512 of FIG. 5C encapsulating the at least one metallization 510 over the at least one die 516 may be removed to leave at least one separated single die or chip 516 including a metallization 510 on the carrier 502, for example by etching or other suitable methods.

According to the embodiment shown in FIG. 5D, after removing the remaining material of the protecting layer 512, the metallization 510 may be recessed or may have a recess with respect to the die or chip 516, wherein for example a step 522 may become apparent between the edge of the die 516 and the sidewall 518 of the metallization 510.

FIG. 6A to FIG. 6D show schematic cross-sectional views illustrating a method for processing a wafer in accordance with an embodiment.

Figure 6A:
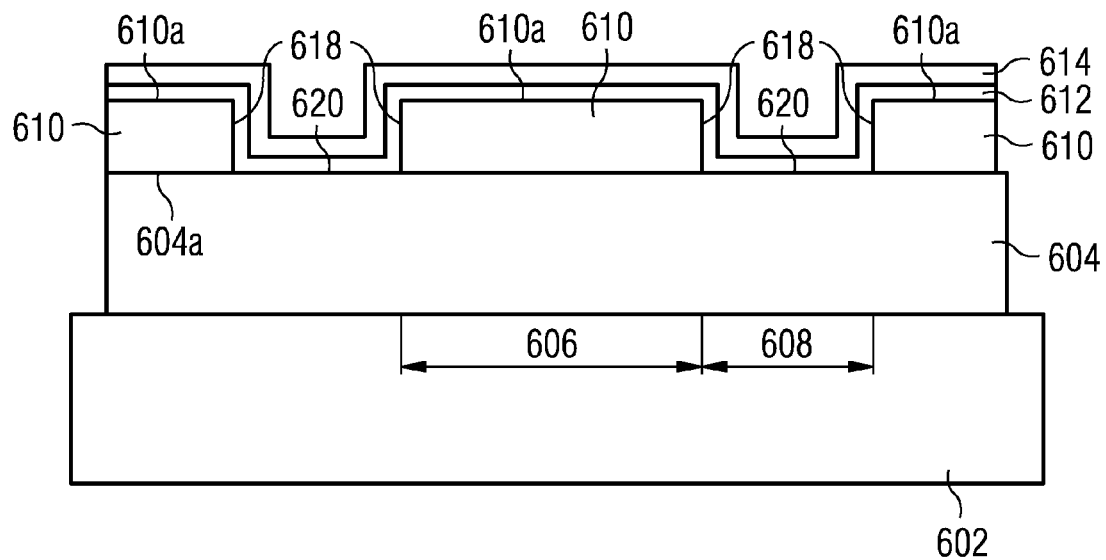
FIG. 6A to FIG. 6F show schematic cross-sectional views illustrating a method for processing a wafer in accordance with another embodiment.

Referring to FIG. 6A, a wafer 604 including at least one die region 606 and at least one kerf region 608 proximate to the at least one die region 606 may be provided, e.g. on a carrier 602. At least one metallization (or metallization structure) 610 may be disposed over the at least one die region 606 of the wafer 604. The at least one metallization 610 may have been formed, for example, by depositing a metallization material over a surface 604a of the wafer 604, e.g. a surface 604a that faces away from the carrier 602. The metallization material may have been patterned, such that the at least one metallization 610 is formed over the at least one die region 606 of the wafer 604. For example, a plurality of metallizations 610 may have been formed, wherein each metallization 610 is formed over a respective die region 606 of a plurality of die regions 606 of the wafer 604.

As shown in FIG. 6A, a protecting layer 612 may be formed by depositing a protecting material over the wafer 604 having the at least one metallization 610 over the at least one die region 606 of the wafer 604, such that the protecting layer 612 covers a surface 610a of the at least one metallization 610 facing away from the wafer 604, sidewalls 618 of the at least one metallization 610, and at least one portion 620 of the surface 604a of the wafer 604 over the at least one kerf region 608. For example, the wafer 604 may include a plurality of kerf regions 608, wherein each kerf region 608 may be located proximate or adjacent to a one or more die regions 606 of a plurality of die regions 606 of the wafer 604, for example between two or more neighboring die regions 606 of the plurality of die regions 606.

According to the embodiment shown in FIG. 6A, the protecting material used for forming the protecting layer 612 may include or consist of a hardmask material such as a nitride material, such as e.g. silicon nitride, and/or an oxide material, such as e.g. silicon oxide.

Further referring to FIG. 6A, a mask layer 614 may be formed over the wafer 604 having the protecting layer 612 over the at least one metallization 610 over the at least one die region 606 of the wafer 604, for example by depositing a resist material (e.g. a photoresist), such that the surface of the protecting layer 612 deposited over the wafer 604 is covered by the mask layer 614.

Figure 6B:
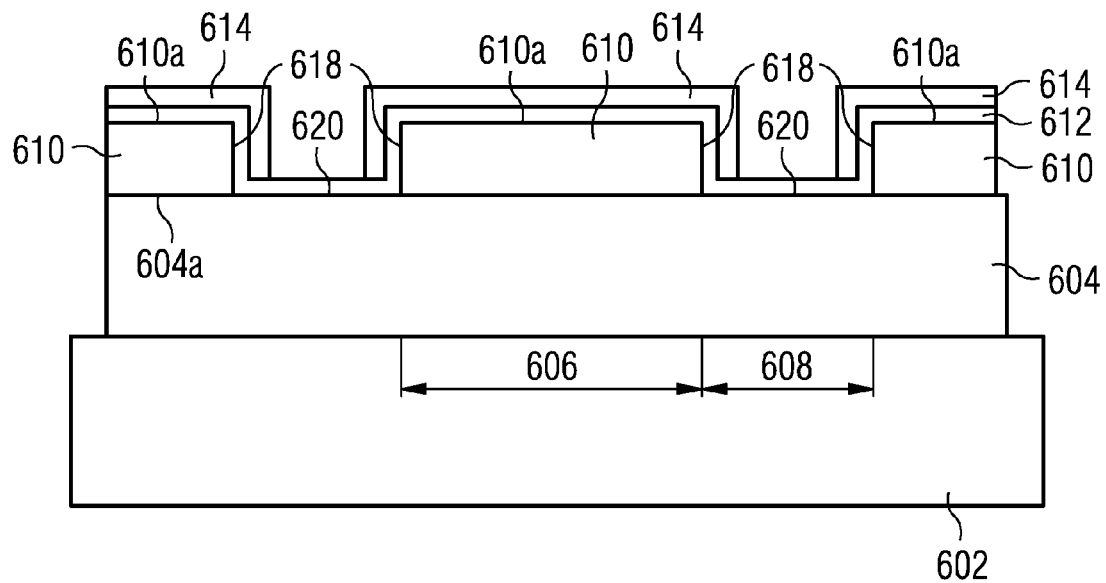

Referring to FIG. 6B, the mask layer 614 may be patterned such that remaining material of the mask layer 614 covers at least one portion of the protecting layer 612 that covers the surface 610a of the at least one metallization 610 facing away from the wafer 604, and at least one portion of the protecting layer 612 that covers the sidewalls 618 of the at least one metallization 610, while material of the mask layer 614 previously covering at least one portion of the protecting layer 612 that covers the at least one portion 620 of the surface 604a of the wafer 604 over the at least one kerf region 608 may be removed again from above the protecting layer 612 such that the at least one portion of the protecting layer 612 that covers the at least one portion 620 of the surface 604a of the wafer 604 over the at least one kerf region 608 of the wafer 604 may be exposed.

According to the embodiment shown in FIG. 6B, the mask layer 614 may include or consist of a resist material, e.g. a photoresist. In case of a photoresist, patterning the mask layer 614 may, for example, include or be achieved by a photolithography process, which may include exposing the photoresist (e.g. using a photolithography mask) and developing the photoresist to obtain the patterned mask layer 614.

Alternatively, the mask layer 614 may be patterned using other suitable processes, which may be known as such in the art.

Figure 6C:
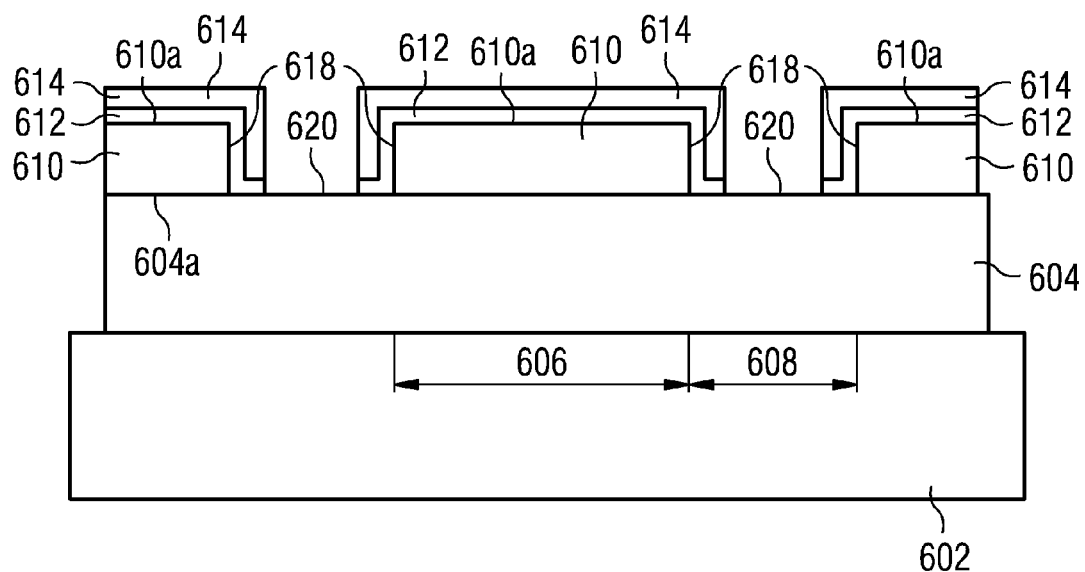

Referring to FIG. 6C, the at least one portion of the protecting layer 612 covering the at least one portion 620 of the surface 604a of the wafer 604 over the kerf region 608 may be removed using the patterned mask layer 614, such that the at least one portion 620 of the surface 604a of the wafer 604 over the at least one kerf region 608 is exposed again, for example between a plurality of metallizations 610.

According to the embodiment shown in FIG. 6C, removing the protecting layer 612 covering the at least one portion 620 of the surface 604a of the wafer 604 over the kerf region 608 may include or may be effected by etching, alternatively using other suitable methods.

Figure 6D:
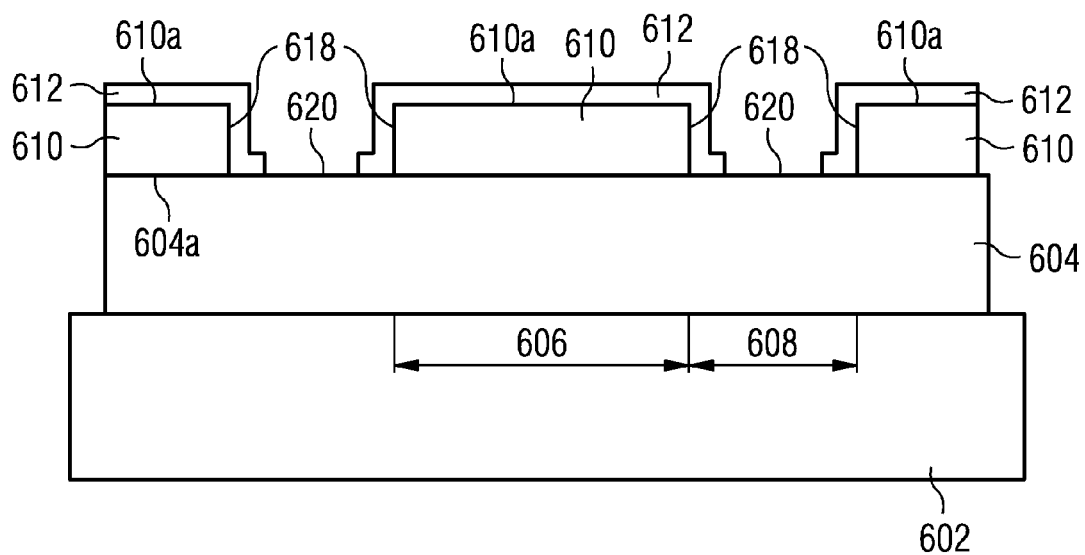

Referring to FIG. 6D, the patterned mask layer 614 may be removed, for example by etching or other suitable methods, to leave the patterned protecting layer 612 over the at least one metallization 610.

Figure 6E:
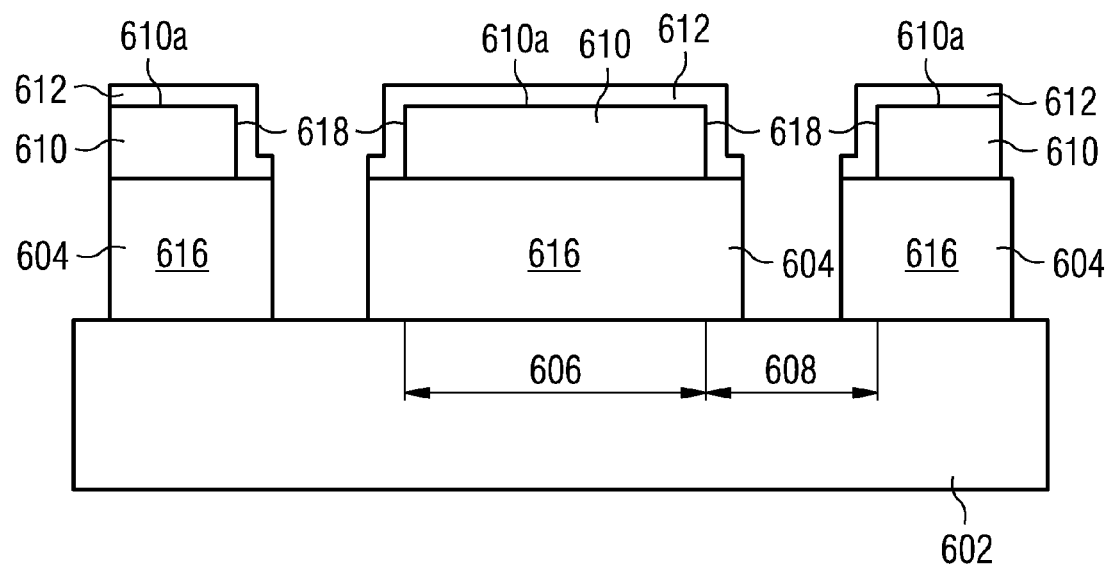

Referring to FIG. 6E, the wafer 604 may be etched by using a plasma etching process, e.g. a Bosch plasma etching process (alternatively, other plasma etching processes), for example by etching the wafer material in the at least one kerf region 608 to form at least one die (or chip) 616. As shown, the at least one die 616 may include the at least one die region 606, and the at least one metallization 610 disposed over the at least one die region 606 and encapsulated by the remaining material of the protecting layer 612.

Figure 6F:
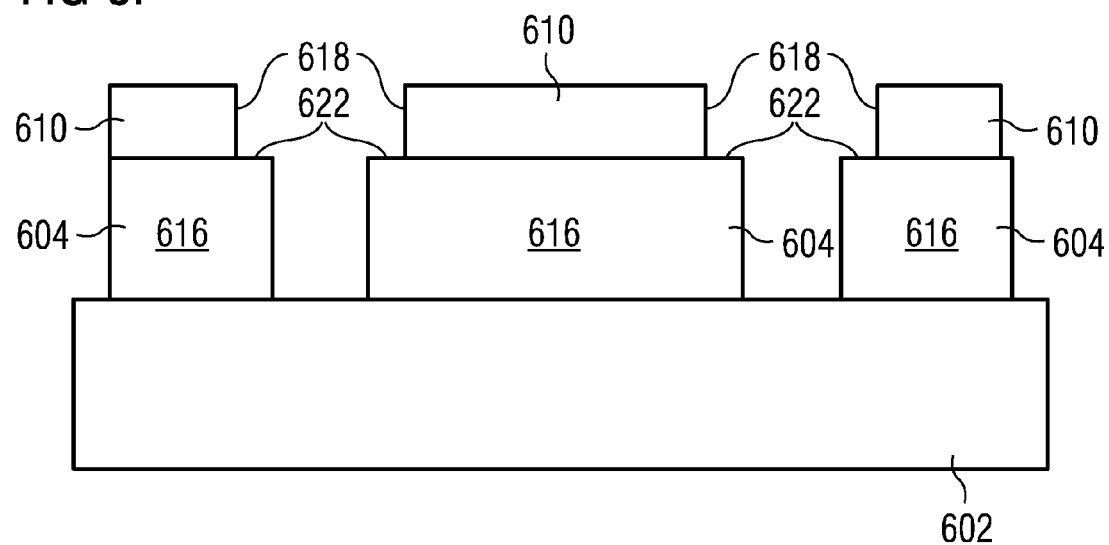

Referring to FIG. 6F, the patterned protecting layer 612 of FIG. 6E encapsulating the at least one metallization 610 over the at least one die or chip 616 may be removed to leave at least one separated single die or chip 616 including a metallization 610 on the carrier 602, for example by etching or other suitable methods.

According to the embodiment shown in FIG. 6F, after removing the remaining material of the protecting layer 612, the metallization 610 may be recessed or may have a recess with respect to the die or chip 616, wherein a step 622 may become apparent between the edge of the die 616 and the sidewall 618 of the metallization 610.

Various embodiments may provide a wafer including at least one die region, at least one metallization disposed over the at least one die region, and at least one protecting layer covering the at least one metallization. The at least one protecting layer may encapsulate the at least one metallization. The at least one protecting layer may be configured to protect the at least one metallization during plasma etching, for example during plasma dicing, as described herein above. The at least one protecting layer may be configured in accordance with one or more embodiments described herein above. For example, the at least one protecting layer may include or be made of a resist material (e.g. photoresist), or a hardmask material (e.g. an oxide material and/or nitride material).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a wafer, comprising:
providing a wafer comprising at least one die region and at least one metallization disposed over the at least one die region;
covering the at least one metallization with a protecting layer wherein the at least one metallization is disposed over a backside of the wafer, wherein the backside of the wafer faces in a direction towards the at least one metallization, wherein covering the at least one metallization with the protecting layer comprises:
depositing the protecting layer over the wafer so that the protecting layer encapsulates the at least one metallization and covers all of one or more top surfaces of the at least one metallization, and
patterning the protecting layer so that the one or more top surfaces of the at least one metallization remains encapsulated by the patterned protecting layer, wherein patterning the protecting layer comprises removing one or more portions of the protecting layer from the backside of the wafer to expose one or more kerf regions at the backside of the wafer; and
plasma etching the wafer to form at least one die wherein plasma etching the wafer comprises dicing the wafer from the backside of the wafer at the one or more exposed kerf regions.

2. The method of claim 1,
wherein the protecting layer comprises a resist material.

3. The method of claim 1,
wherein the protecting layer comprises a hardmask material.

4. The method of claim 3,
wherein the hardmask material comprises at least one of an oxide material and a nitride material.

5. The method of claim 1,
wherein the protecting layer comprises a layer stack comprising an oxide layer and a nitride layer.

6. The method of claim 1,
wherein covering the at least one metallization with a protecting layer comprises:
depositing a first protecting sub-layer to cover a surface of the at least one metallization that faces away from the wafer;
depositing a second protecting sub-layer to cover the first protecting sub-layer and at least one sidewall of the at least one metallization;
etching the second protecting sub-layer to form at least one spacer covering the at least one sidewall of the at least one metallization.

7. The method of claim 6,
wherein at least one of the first protecting sub-layer and the second protecting sub-layer comprises a nitride material or an oxide material.

8. The method of claim 1,
wherein the plasma etching comprises a Bosch plasma etching process.

9. The method of claim 1,
wherein patterning the protecting layer comprises a photolithography process.

10. The method of claim 1, wherein the at least one metallization is disposed directly on the wafer.

11. A method for processing a wafer, comprising:
providing a wafer comprising at least one die region and at least one metallization disposed over the at least one die region;
covering the at least one metallization with a protecting layer wherein the at least one metallization is disposed over a backside of the wafer, wherein the backside of the wafer faces in a direction towards the at least one metallization, wherein covering the at least one metallization with a protecting layer comprises:
depositing a first protecting sub-layer to cover a surface of the at least one metallization that faces away from the wafer, and
depositing a second protecting sub-layer to cover the first protecting sub-layer and at least one sidewall of the at least one metallization, and
etching the second protecting sub-layer to from at least one spacer covering at least one sidewall of the at least one metallization; and
plasma etching the wafer to form at least one die wherein plasma etching the wafer comprises dicing the wafer from the backside of the wafer.

12. The method of claim 11,
wherein at least one of the first protecting sub-layer and the second protecting sub-layer comprises a nitride material or an oxide material.

13. A method for processing a wafer, comprising:
providing a wafer comprising at least one die region and at least one metallization disposed over the at least one die region;
covering the at least one metallization with a protecting layer wherein the at least one metallization is disposed over a backside of the wafer, wherein the backside of the wafer faces in a direction towards the at least one metallization, wherein covering the at least one metallization with the protecting layer comprises:
depositing the protecting layer over the wafer so that the protecting layer encapsulates the at least one metallization and covers all of one or more surfaces of the at least one metallization facing away from the wafer, and patterning the protecting layer so that the at least one metallization remains encapsulated by the patterned protecting layer, wherein patterning the protecting layer comprises removing one or more portions of the protecting layer from the backside of the wafer to expose one or more kerf regions at the backside of the wafer;

plasma etching the wafer to form at least one die wherein plasma etching the wafer comprises dicing the wafer from the backside of the wafer at the one or more exposed kerf regions; and removing the protecting layer after plasma etching the wafer.

14. The method of claim 13, wherein after removing the protecting layer the at least one metallization is recessed with respect to at least one edge of the at least one formed die.

15. A method for processing a wafer, comprising:

providing a wafer comprising at least one die region and at least one metallization disposed over the at least one die region;

covering the at least one metallization with a protecting layer wherein the at least one metallization is disposed over a backside of the wafer, wherein the backside of the wafer faces in a direction towards the at least one metallization, wherein covering the at least one metallization with the protecting layer comprises:

depositing the protecting layer over the wafer so that the protecting layer encapsulates the at least one metallization and covers all of one or more surfaces of the at least one metallization facing away from the wafer, and patterning the protecting layer so that the at least one metallization remains encapsulated by the patterned protecting layer, wherein patterning the protecting layer comprises removing one or more portions of the protecting layer from the backside of the wafer to expose one or more kerf regions at the backside of the wafer; and plasma etching the wafer to form at least one die wherein plasma etching the wafer comprises dicing the wafer from the backside of the wafer at the one or more exposed kerf regions, wherein all of the at least one metallization is disposed over the backside of the wafer.

\* \* \* \* \*